US012674234B2

(12) United States Patent
Hahn et al.

(10) Patent No.: US 12,674,234 B2
(45) Date of Patent: Jul. 7, 2026

(54) METHOD FOR ASCERTAINING THE END OF A CLEANING PROCESS FOR A PROCESS CHAMBER OF A MOCVD REACTOR

(71) Applicant: AIXTRON SE, Herzogenrath (DE)

(72) Inventors: Utz Herwig Hahn, Raeren (BE);
Martin Eickelkamp, Würselen (DE);
Dirk Fahle, Mönchengladbach (DE)

(73) Assignee: AIXTRON SE, Herzogenrath (DE)

( * ) Notice: Subject to any disclaimer, the term of this patent is extended or adjusted under 35 U.S.C. 154(b) by 854 days.

(21) Appl. No.: 17/912,277

(22) PCT Filed: Mar. 17, 2021

(86) PCT No.: PCT/EP2021/056834
§ 371 (c)(1),
(2) Date: Sep. 16, 2022

(87) PCT Pub. No.: WO2021/185915
PCT Pub. Date: Sep. 23, 2021

(65) Prior Publication Data
US 2023/0160062 A1      May 25, 2023

(30) Foreign Application Priority Data
Mar. 18, 2020      (DE) ..................... 10 2020 107 518.9

(51) Int. Cl.
*C23C 16/44*          (2006.01)
(52) U.S. Cl.
CPC ...... *C23C 16/4405* (2013.01); *C23C 16/4408* (2013.01)
(58) Field of Classification Search
CPC ............ C23C 16/4405; C23C 16/4408; C23C 16/301
See application file for complete search history.

(56) References Cited

U.S. PATENT DOCUMENTS 6,238,488 B1 * 5/2001 Fujita ..................... C23C 16/52
                                                          118/724
6,919,279 B1   7/2005 Rulkens et al.
                    (Continued)

FOREIGN PATENT DOCUMENTS

DE          10043601 A1      3/2002
DE     102007009145 A1      8/2008
                    (Continued)

OTHER PUBLICATIONS

WO-2018043446-A1, Machine Translation. (Year: 2025).*
                    (Continued)

*Primary Examiner* — Binh X Tran
*Assistant Examiner* — Christopher Remavege
(74) *Attorney, Agent, or Firm* — Ascenda Law Group, PC

(57)          ABSTRACT

In a cleaning process for removing parasitic depositions on surfaces of a process chamber of a CVD reactor, a susceptor of the CVD reactor is heated by a heating device, and the susceptor is regulated to a specified temperature or is heated with a constant heat output. Concurrently, an etching gas is supplied to the heated process chamber. The thermal response of at least one object is monitored, in which thermal response is the temperature of the wide face of a process chamber cover, the wide face facing away from the process chamber. The parasitic depositions influence the emissivity of the surface of the process chamber cover, the emissivity influencing the temperature distribution in the process chamber. The supply of etching gas is terminated when the temperature reaches a comparison value, the temperature changing in response to changes in the surface emissivity during the cleaning process.

20 Claims, 3 Drawing Sheets

(56) References Cited

U.S. PATENT DOCUMENTS

| | | | | |
|---|---|---|---|---|
| 8,083,960 | B2 | 12/2011 | Uchida et al. | |
| 10,544,519 | B2 | 1/2020 | Savas et al. | |
| 11,618,946 | B2 * | 4/2023 | Lindley | G06Q 10/04 |
| | | | | 702/130 |
| 2002/0151186 | A1 * | 10/2002 | Cui | H10P 72/0604 |
| | | | | 438/758 |
| 2005/0279384 | A1 * | 12/2005 | Guidotti | C23C 16/52 |
| | | | | 156/345.1 |
| 2008/0251104 | A1 * | 10/2008 | Chen | H10P 72/0604 |
| | | | | 134/58 R |
| 2010/0273320 | A1 * | 10/2010 | Kappeler | C23C 16/46 |
| | | | | 118/725 |
| 2012/0064698 | A1 | 3/2012 | Olgado | |
| 2012/0160173 | A1 * | 6/2012 | Endo | C23C 16/4412 |
| | | | | 118/728 |
| 2021/0285100 | A1 * | 9/2021 | Habuka | C23C 16/46 |
| 2021/0292894 | A1 * | 9/2021 | Peng | C23C 16/52 |

FOREIGN PATENT DOCUMENTS

| | | | |
|---|---|---|---|
| DE | 102012101438 A1 | | 8/2013 |
| JP | H10163116 A | * | 6/1998 |
| WO | 9801894 A1 | | 1/1998 |
| WO | 2007/041454 A2 | | 4/2007 |
| WO | 2018/035418 A1 | | 2/2018 |
| WO | WO-2018043446 A1 * | 3/2018 | B08B 13/00 |

OTHER PUBLICATIONS

JP H10163116 A, Machine Translation. (Year: 2026).*

International Search Report mailed Jun. 8, 2021, from the ISA/European Patent Office, for International Patent Application No. PCT/EP2021/056834 (filed Mar. 17, 2021), 8 pgs.

Written Opinion mailed Jun. 8, 2021, from the ISA/European Patent Office, for International Patent Application No. PCT/EP2021/056834 (filed Mar. 17, 2021), 9 pgs.

Written Opinion mailed Jun. 8, 2021, from the ISA/European Patent Office, for International Patent Application No. PCT/EP2021/056834 (filed Mar. 17, 2021), English translations, 9 pgs.

International Preliminary Report on Patentability issued Sep. 20, 2022, from The International Bureau of WIPO, for International Patent Application No. PCT/EP2021/056834 (filed Mar. 17, 2021), 19 pgs.

* cited by examiner

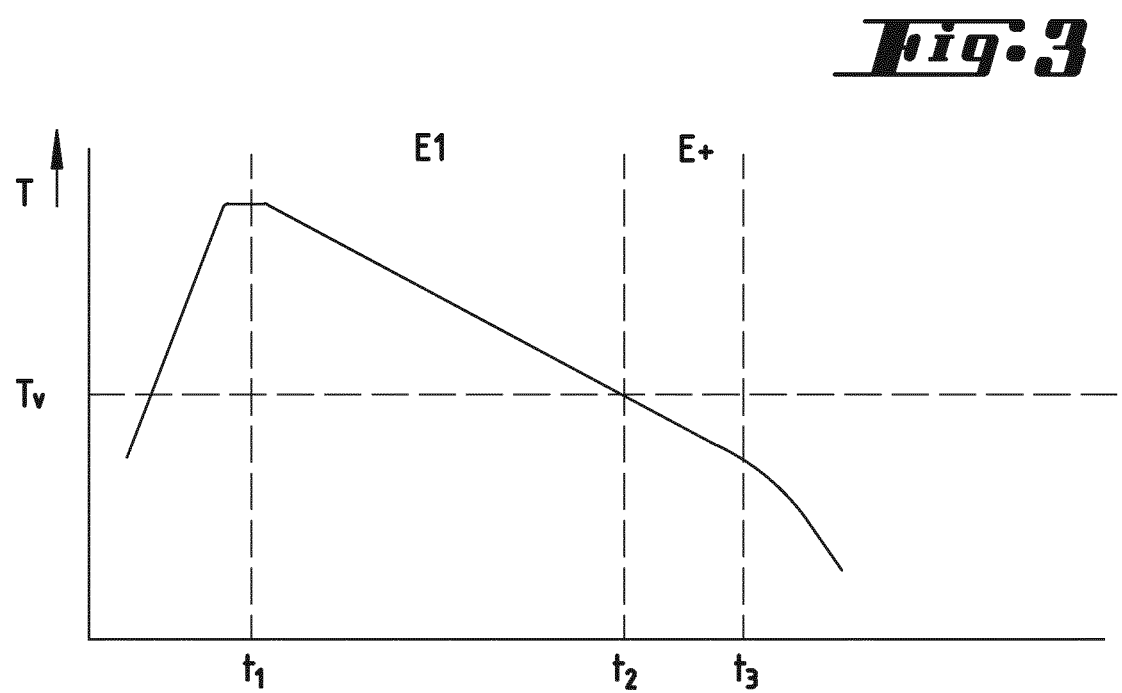
_Fig. 3_
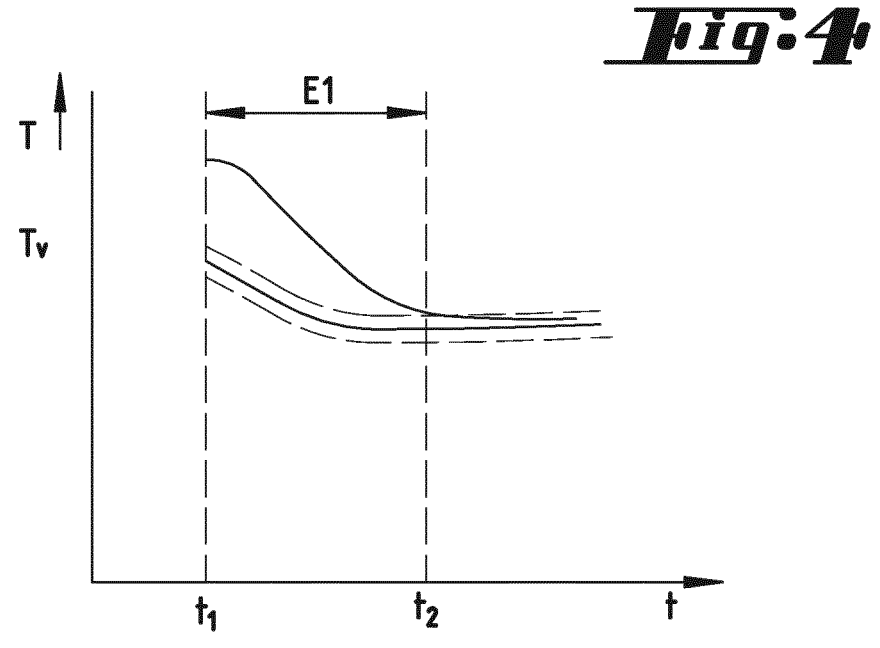
_Fig. 4_

METHOD FOR ASCERTAINING THE END OF A CLEANING PROCESS FOR A PROCESS CHAMBER OF A MOCVD REACTOR

RELATED APPLICATIONS

This application is a National Stage under 35 USC 371 of and claims priority to International Application No. PCT/EP2021/056834, filed 17 Mar. 2021, which claims the priority benefit of DE Application No. 10 2020 107 518.9, filed 18 Mar. 2020.

FIELD OF THE INVENTION

The invention relates to a method for removing parasitic depositions from surfaces of a process chamber of a CVD reactor having a susceptor that can be heated by a heating device, in the course of which an etching gas is supplied into the process chamber that is heated to an elevated temperature, wherein measured values are obtained by monitoring a thermal response of at least one object in, or in the region near, the process chamber, and the supply of the etching gas is terminated when the measured values attain a comparison value, wherein in the course of the supply of the etching gas, a temperature control body is regulated to a specified temperature, or is heated with a constant heat output.

The invention further relates to a device for the execution of the method, comprising a CVD reactor with a process chamber that is arranged in a housing of the CVD reactor, which has a susceptor with a multiplicity of storage locations, in each case for the storage of at least one substrate, a heating device for the heating of the susceptor, a gas inlet unit, with one or a plurality of surfaces on which, when executing a coating process, at least one organometallic compound of an element of the II- or III-main group and at least one hydride of an element of the V- or VI-main group can be coated, in which at least one organometallic compound of an element of the II- or III-main group and at least one hydride of an element of the V- or VI-main group are supplied, together with a carrier gas, through the gas inlet unit into the process chamber, parasitic depositions are formed, a measuring device for ascertaining a thermal response of at least one object in, or in the region near, the process chamber, and with a control device that controls valves and mass flow rate regulators for the generation of a flow of an etching gas through the process chamber, and switches off the flow of the etching gas into the process chamber when a measured value obtained from the thermal response attains a comparison value.

BACKGROUND

A CVD reactor, in particular an MOCVD reactor, is used to deposit a plurality of layers, in particular of a III-V- or a II-VI-material, in successive deposition steps on a number of substrates that are simultaneously placed on a susceptor in a process chamber of the reactor, for which purpose organometallic reaction gases and hydrides are supplied into the process chamber, together with a carrier gas, for example hydrogen. The process chamber is heated up to a process temperature. Not only the substrates, but also the walls of the process chamber, thereby have a temperature at which a coating forms on the surfaces. The desired layer forms on the substrates. Parasitic depositions form on the surfaces. These parasitic depositions must be removed at regular intervals, in particular in each case after the processed substrates have been removed from the process chamber. For this purpose, an etching gas, which can contain chlorine, or can be chlorine, is supplied into the process chamber, for example by means of a gas inlet unit, or another gas supply line. In the prior art, provision is made in particular that in a plurality of successive phases or steps, a first etching gas, for example chlorine or HCl, and subsequently a second etching gas, for example ammonia, are supplied into the process chamber for a specified time to remove carbon residues. The said etching steps or phases are executed for a specified time, or a specified number of these etching cycles are executed.

U.S. Pat. No. 8,083,960 B2 describes a device and a method, with which the luminescence at a specific wavelength is measured in the course of a dry etching process of a semiconductor wafer, in order to determine the end of the etching process in time, wherein a regression line is calculated from measured values obtained in the course of the dry etching.

U.S. Pat. No. 6,919,279 B1 describes a method for the plasma etching of a surface. In the course of the etching process, a spectral emission rate of two or more light-emitting reaction components is recorded.

WO 2007/041454 describes a cleaning process, in which a thermal response of at least one object is monitored, and measured values are obtained therefrom, which are compared with comparison values. The cleaning process is terminated when the measured values attain the comparison value. A special sensor is used, with a sensor body that is held at a constant temperature.

WO 2018/035 418 A1 describes a plasma coating device with a showerhead and a susceptor. By the introduction of a cleaning gas, the process chamber can be cleaned with the aid of a plasma. Here temperatures in the process chamber are measured with temperature sensors, and the cleaning process is discontinued when a threshold value is attained.

Cleaning processes are also of known in the art from U.S. Pat. No. 10,544,519 B2 or DE 10 2012101438 A1. A CVD reactor is, for example, described in DE 100 43 601 A1.

SUMMARY OF THE INVENTION

It is the object of the invention to optimize the method for removing parasitic depositions from surfaces of a process chamber of a CVD reactor. It is also the object of the invention to specify means that ensure that the etching step, or etching cycle, is of sufficient length for the parasitic depositions to be removed to a sufficient extent, and for the etching cycle not to be executed for too long, as the latter not only increases the cost, but also reduces the life of the components exposed to the etching gas.

The object is achieved by the invention as specified in the claims, wherein the subsidiary claims represent not only advantageous developments of the independent claims, but also autonomous solutions of the object.

In accordance with a first aspect of the invention, it is proposed that in the course of the cleaning process the thermal response of an object in, or in the region near, the process chamber, is monitored. In the course of the monitoring, at least one measured value is obtained which changes as a result of a decrease in the thickness of a parasitic coating of a surface of the process chamber. This measured value is compared with a comparison value. If the measured value attains the comparison value, the cleaning process is terminated. The comparison value can be a reference value, to which a tolerance limit is applied, for example a window in a temperature range, or a limiting temperature. In particular, provision is made that in the course of the supply of the etching gas, a temperature control body is regulated to a specified temperature. In the invention, the temperature control body is the susceptor supporting the substrates in the course of the deposition process. This is heated with a heating device. A temperature sensor is provided, which measures, for example, a temperature of the face of the susceptor facing towards the heating device, wherein this temperature is held at a constant value by a regulation device. In the course of the supply of the etching gas, the thermal response of a surface of this, or another, component of the process chamber can be determined, and measurements can be obtained therefrom. For example, the temperature of the other component, which has the parasitic coating to be removed, can be measured. In accordance with one variant of the invention, this other component takes the form of a process chamber cover. The process chamber cover can extend parallel to the susceptor, such that the process chamber is located between the susceptor and the process chamber cover. Provision can be made for the temperature to be measured on the rear face of the process chamber cover, facing away from the process chamber. This can take place with a pyrometer, or a thermocouple, or in another manner. The surface on which the temperature is measured can have no parasitic depositions. However, the body whose temperature is measured can have another surface that has the parasitic depositions. On a process chamber cover the temperature is preferably measured on a coating-free surface, which is located opposite a parasitically coated surface. The process chamber cover, that is to say, the other component whose thermal response is monitored, is preferably located in a heat transport path between a heat source, which is the susceptor heating device or the susceptor surface, and a heat sink, which is formed by a housing wall or a process chamber wall, which is cooled by means of a cooling device with a constant cooling performance, or is regulated to a constant temperature by means of a regulator and the cooling device. The parasitic coating influences the emissivity of the component whose thermal response is monitored. If the emissivity of the component changes, the heat flux between the heat source and the heat sink changes, and, at the same time, the temperature of the component changes. By continuous measurement of the temperature of the component located in the heat transport path, it is thus possible to determine when the coating has been removed to a sufficient degree. For this purpose, the measured value, which in the present case can be a temperature, is compared with a comparison value. The comparison value can be determined in preliminary tests, for example by operating the process chamber with the same process parameters that are set in the course of the cleaning process, with components free of parasitic coatings, and measuring the temperatures in the course of this operation. The comparison temperature can be, for example, a temperature determined in such a preliminary test, to which a tolerance value is applied. The cleaning process can, for example, be executed until the temperature measured in the process has approached the temperature determined in the preliminary tests within, for example, 5K or 3K. When this condition is attained, the cleaning step is terminated. In one variant of the invention, provision can be made for a temperature of the component of the process chamber having the parasitic coating that is to be removed, for example the process chamber cover, to be held at a constant temperature in the course of the cleaning step. This is done, for example, by supplying a temperature control gas into a gap between the rear face of the process chamber cover, facing away from the process chamber, and a cooled housing wall. The gas composition of the temperature control gas can be varied by means of a mass flow rate regulator. The temperature control gas preferably consists of an adjustable mixture of a gas with a high thermal conductivity, for example hydrogen, and a gas with a low thermal conductivity, for example nitrogen. However, two noble gases with different thermal conductivities can also be used. In this variant, the mixing ratio, or the mass flow rate of the temperature control gas, is monitored. The comparison value in this variant is a mixing ratio or a mass flow rate of the temperature control gas that is supplied into the gap in preliminary tests, with otherwise identical process parameters, but using clean components. Here the process parameters are, in particular, at least one susceptor temperature, which is held constant, or a heat output, with which the temperature of the susceptor is controlled, and which is held constant, a carrier gas flow through the process chamber, which is held constant, and a total pressure within the process chamber, which is held constant. In one variant of the invention, provision can be made for the body to be cleaned, whose thermal response is monitored, to be the susceptor, or a holding device located on the susceptor, a substrate holder carried by the susceptor, or similar (in particular a base module or a ring combination). In particular, all regions formed by the susceptor, or bodies carried by the susceptor, can be considered. While the temperature of the face of the susceptor facing towards the heating device is held constant, for example by measuring the temperature there by means of a temperature measuring device, for example a pyrometer, a thermocouple, or a light guide, the temperature of the wide face of the susceptor facing towards the process chamber changes due to the changing emissivity of the surface in the course of the etching process. This temperature can be measured optically, for example with a pyrometer. In one variant, provision can be made for the comparison value to be determined in the course of the etching step. Prior to the removal of the parasitic coating, one or more IV-IV-layers, III-V-layers, or II-VI-layers are simultaneously deposited on a multiplicity of substrates arranged on storage locations of the susceptor by supplying at least one organometallic compound of an element of the II-, III- or IV-main group and at least one hydride of an element of the IV-, V- or VI-main group, together with a carrier gas. The process gas formed by the reactive gases is supplied into the process chamber through a gas inlet unit. The gas inlet unit can take the form of a central gas inlet unit arranged in the center of the process chamber. However, the gas inlet unit can also be a showerhead that in some measure forms the process chamber cover, and forms a gas outlet surface that has a multiplicity of gas outlet openings facing towards the process chamber. The gas inlet unit can have first exit openings through which a first reactive gas is supplied into the process chamber, and second exit openings through which a second reactive gas is supplied into the process chamber, so that the two reactive gases only come into contact with each other in the process chamber. In the course of this deposition process, the storage locations of the substrates are screened so that no parasitic deposition takes place there. However, parasitic deposition does take place on the intermediate surfaces between the storage locations on the wide face of the susceptor facing towards the process chamber. In the course of the cleaning step, the temperatures that are present there can be measured, and the measured values can be treated as comparison values. The etching step is terminated if the temperatures measured on the coated intermediate surfaces have sufficiently approached the comparison values. It is not just a measured temperature that can be used as a thermal response. The heat output of the heating device, with which the susceptor is heated to a specified temperature, can also be used. However, a temperature measured, for example, on the wide face of the susceptor facing towards the heating device, can also be used as the thermal response if the susceptor is heated with a constant heat output. The changing optical properties of the surfaces in the course of removal of the parasitic coatings affect the heat flux from a heat source, such as the heating device used to heat the susceptor, to a heat sink, such as a cooled process chamber wall. The change in the heat flux causes temperature changes in the heat transport path. The cleaning step can be a single cleaning step that is terminated when the measured value obtained by monitoring a thermal response attains the comparison value. Provision can be made for the cleaning step to be continued for a specified time after the measured value has attained the comparison value, for safety reasons. If the comparison value is a temperature, it can be the temperature that has been determined under clean conditions with otherwise identical process parameters, and has been modified by a safety addition or safety deduction of, for example, 3K or 5K. In one variant of the invention, it is proposed that the cleaning step consists of a multiplicity of cycles, wherein each cycle comprises an etching phase that can have a specified length. Between two etching phases, the process chamber can be purged with a purging gas, such that each cycle comprises at least one etching phase and one purging phase. However, provision can also be made that in a first etching phase, in which metals, or metal-containing compounds, are removed from the surfaces with an etching gas containing an element of the VII-main group, and that if necessary, after an intermediate phase, in which a purging gas is supplied into the process chamber, a second etching phase is executed, in which, for example, ammonia is supplied into the process chamber in order to remove carbon compounds from the surfaces of the components to be cleaned. These cycles, containing two or more phases, are executed in succession until a measured value determined at the same time, which represents a thermal response, achieves a specified value. In a development of the invention, provision can be made that the system permanently learns, and, by way of machine learning, the comparison value is permanently adjusted to the changing ambient conditions by virtue of drift, or similar. Here, for example, process results of subsequent deposition processes can be assessed, and the assessment of these process results, for example properties of the layers deposited on the substrates, can be used to decide whether the cleaning process has been executed with a sufficient intensity. Instead of a temperature measurement, however, provision can also be made for other optical properties, for example the emissivity of the surfaces to be cleaned, to be measured continuously, and for these measured values to be compared with comparison values in order to terminate the supply of the etching gas in the event that these measured values fall below or exceed a threshold value. While the comparison value in the course of the temperature measurement can be a reference temperature with a safety margin applied, in the course of the measurement of emissivities, the comparison value can be a measured value of a reference emissivity with a safety margin applied. It is considered advantageous if, in order to determine the point in time for the termination of the supply of the etching gas or for the termination of the etching step or the etching cycles, measured values are measured with an optical measuring device on a surface of a body, which measured values change because the body is in a heat transfer path between a heat source, which has a higher temperature than the body, and a heat sink, which has a lower temperature than the body, and because thermal radiation is an essential mechanism of heat transfer between the heat source and the body, or between the body and the heat sink, wherein at least one surface of the body has an optical property which changes continuously in the course of the etching step, wherein the body is a functional component of the process chamber.

With a device as previously described, a variant of the method in accordance with a further aspect of the invention can also be executed, in which the comparison value changes in the course of the supply of the etching gas. The comparison value can thus be either a specified or a variable comparison value. In one variant of the invention, provision can be made for the comparison value to be dependent on the time profile of a thermal response, for example of a temperature of another object in the region near the process chamber, or in the process chamber. Provision can be made for the comparison value to be a second temperature measured in the CVD reactor. Provision can furthermore be made for the second comparison value to be a second temperature measured in the CVD reactor, provided with an additive constant. To determine the comparison value, a second thermal response of a second object can be permanently monitored in the course of the etching step. This can take place with the means previously described. In particular, first means can be provided for monitoring the first thermal response, and second means can be provided for monitoring the second thermal response. In accordance with a preferred configuration of the method in accordance with the invention, or of a program of a control device, the first thermal response is measured on a susceptor, and the second thermal response is measured on a cover of the process chamber. A temperature measuring device, in particular an optically operating temperature measuring device, can be used to measure the thermal response of a region of the susceptor that remains uncoated in the course of the execution of the coating process. With a further, in particular an optically operating, second temperature measuring device, the thermal response of a location on the cover of the process chamber can be measured. This can be a location that remains uncoated in the course of the coating process. It can also be a location where a parasitic coating forms in the course of execution of the coating process. The monitoring of the two thermal responses, which preferably take the form of temperature measurements or emission measurements, takes place continuously, quasi-continuously, or periodically, in the course of the etching process.

In one variant of the invention, provision can be made for each of the two thermal responses to be represented by a measured value and a relationship, for example, a difference, to be formed from the two measured values. More generally, provision can be made that a mathematical relationship exists between the measured values. In one example embodiment, provision can be made for a relationship, for example a difference, to be formed between a temperature measured at a location on the susceptor, and a temperature measured at a location on a process chamber cover. This relationship, for example the difference, can be compared with a comparison value. The etching process, that is to say, the supply of the etching gas, can be terminated if the relationship, for example the difference, between the two measured values, falls within a window set about a comparison value, that is to say, falls within a specified distance from the comparison value. However, provision can also be made for the slope of a measurement curve obtained from the measured values to be monitored in the course of the etching process. Such a measurement curve can approach a final value asymptotically. Provision can furthermore be made for the absolute value of the time derivative of one of the measured values, or of the relationship, for example the difference, between two measured values, or of only one measured value, to be monitored. A value can be specified that is a threshold value of the time derivative. If the absolute value of the time derivative of a measured value, two measured values, or a relationship, for example the difference, between two measured values, falls below the threshold value, the supply of the etching gas is terminated.

BRIEF DESCRIPTION OF THE DRAWINGS

In what follows, example embodiments of the invention are explained with reference to the accompanying figures. Here:

FIG. 3 shows an illustration as in FIG. 2 for a second example embodiment, FIG. 4 shows an illustration similar to FIG. 3 of a time profile of the change in a measured temperature value.

DETAILED DESCRIPTION

Figure 1:
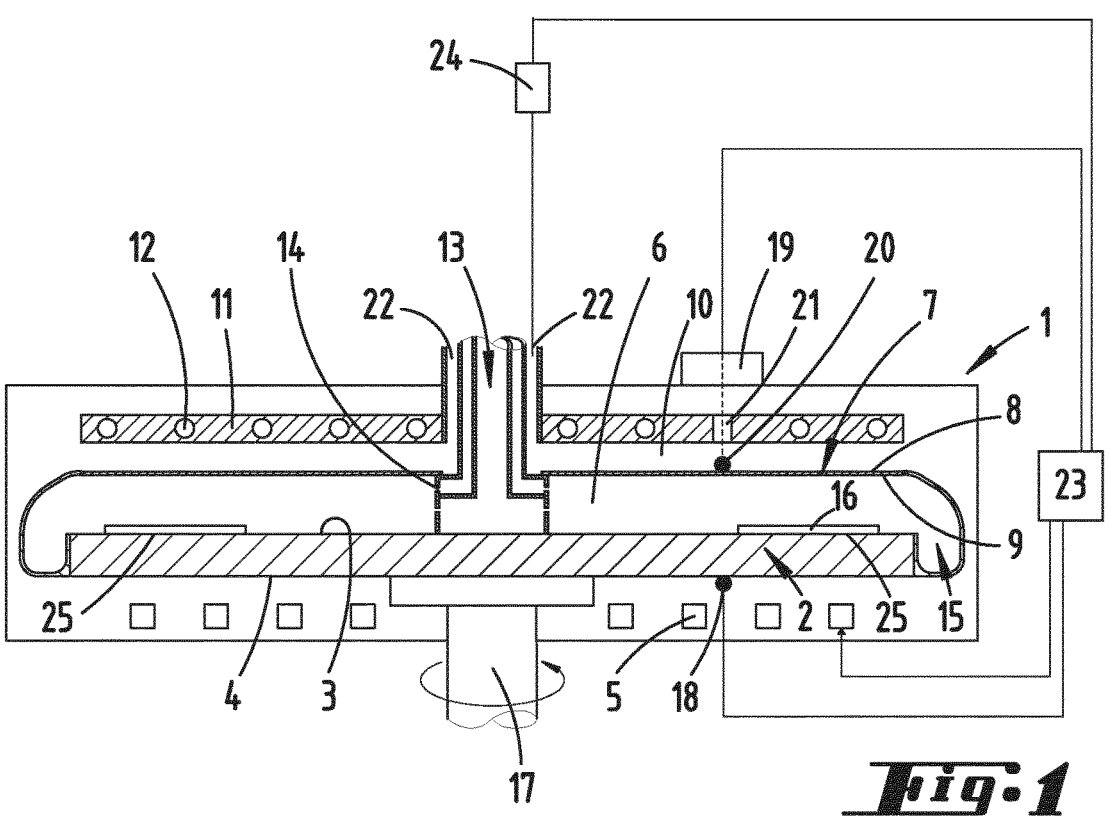
FIG. 1 shows a schematic cross-section of an MOCVD reactor.

FIG. 1 shows, very schematically, an MOCVD reactor that has a housing 1, which seals the interior of the housing 1 from the environment of the housing in a gas-tight manner. In the interior of the housing 1, there is located a susceptor 2 made of graphite, for example coated graphite, which is designed in the form of a circular disc. The susceptor 2 has a downwardly facing wide face 4, on which a temperature can be measured with a temperature sensor 18 at the point indicated by the reference number 18. The wide face 4 faces towards a heating device 5, with which the susceptor 2 can be heated. The heating device 5 can be an IR-heating device, or an RF-heating device. Opposite the wide face 4 of the susceptor 2 is located a wide face 3, which faces towards a process chamber 6. On the wide face 3 lie one or a plurality of substrates 16, which can be of a III-V-material, a IV-material, or sapphire, or similar. In the center of the process chamber 6 is located a gas inlet unit 13, which has two gas inlet channels, through which two different reactive gases can be supplied separately into the process chamber 6. One reactive gas can be an organometallic compound of an element of the III-main group. A second reactive gas can be a hydride of a compound of an element of the V-main group. The heating device 5 is used to heat the surfaces of the substrates 16 up to a temperature at which the reactive gases decompose, and the reaction products react with each other, such that a layer is deposited on the surface of the substrate 16. The layer can be a crystalline layer. It can also be amorphous. The layer can be a III-V-layer. Various deposition steps are executed in succession, separated by purging steps, in the course of which the temperature of the susceptor can also be changed, in which layers with different compositions and thicknesses are deposited on the substrates 16. Gaseous reaction products can be exhausted by means of a pump (not shown) through a gas outlet unit 15, which surrounds the process chamber 6 in an annular manner. The susceptor 2 is supported on a shaft 17, which can be rotated so as to rotate the susceptor 2 relative to the process chamber cover 7.

The process chamber 6 is bounded at the bottom by the wide face 3 of the susceptor 2, and at the top by a wide face 9 of a process chamber cover 7 extending parallel to the susceptor 2. In the example embodiment, the process chamber cover 7 is a thin, temperature-stable disc made of coated graphite, ceramic, quartz or another suitable material. It has a wide face 8 that faces towards a gap 10. The wide face 8 faces away from the wide face 9 and the process chamber 6, and towards a cooling device 11, such that the gap 10 extends between the cooling device and the process chamber cover 7. The cooling device 11 has cooling channels 12, through which a coolant can flow.

Above an opening 21 in the cooling device 11, that is to say, in the wall formed by the cooling device 11, is located a temperature measuring device 19, which can take the form of a pyrometer. The measuring device 19 measures a temperature of the process chamber cover 7 at a measuring point 20. A temperature control gas supply line 22 opens out into the gap 10, into which a temperature control gas provided by a temperature control gas source 24 can be supplied into the gap 10. The temperature control gas consists of two gases that have different thermal conductivity properties, for example nitrogen and hydrogen, or helium and argon. By varying the mixing ratio of the two gases, the heat transfer from the process chamber cover 7 to the process chamber wall, which in the example embodiment is formed by the cooling device 11, can be varied.

In the course of the deposition of layers onto the surfaces of the substrates 16 described above, a susceptor temperature measured with the temperature sensor 18 is held at a constant value by means of a regulation device (not shown) of a control device 23. For this purpose, the heat flux to the susceptor 2, generated by the heating device 5, is varied. The temperature of the coolant flowing through the cooling channel 12 is also held at a specified coolant temperature. A temperature control gas is provided by the temperature control gas source 24, which gas is supplied into the gap 10. The composition of the temperature control gas is varied in such a way that the temperature of the rear face of the process chamber cover 7, measured at the measuring point 20, remains at a constant value.

In the course of the coating of the substrates 16, parasitic coatings are deposited on the wide face 9 of the process chamber cover facing towards the process chamber 6, and on the regions of the wide face 3 of the susceptor 2 facing towards the process chamber 6 that are not covered by the substrates 16. These parasitic coatings are to be removed after the coating process. For this purpose, the invention proposes a plurality of variants, of which some are discussed in detail below.

An etching gas containing chlorine or a chlorine-containing compound is supplied into the process chamber through the gas inlet unit 13, or through other supply lines (not shown in the figures). This takes place together with an inert gas, for example nitrogen. The process chamber is heated to temperatures above 500, 600 or 700° C., at which parasitic coatings, in particular those containing metal, are removed from the wide face 9 of the process chamber cover 7 facing towards the process chamber 6 by a chemical reaction in which chlorides can form.

The parasitic coatings on the wide faces 9, 3 lead to an change in the optical properties of the wide faces 9, 3. By virtue of a temperature gradient between the wide face 3 and the wide face 9, a heat flux from the susceptor 2 to the process chamber cover 7 takes place in the course of the etching process (but also in the course of the growth process). The heat transport mechanism is, on the one hand, the heat conduction via the gas supplied into the process chamber 6 at pressures below atmospheric pressure, to some extent also convection, but is essentially the heat radiation from the susceptor 2 to the process chamber cover 7. The heat transferred by means of thermal radiation depends on the optical properties of the wide faces 9, 3, which differ if the wide faces 9, 3 are free of coatings, that is to say, clean, or if the wide faces 9, 3 have a parasitic coating. As a result, a temperature measured on the wide face 3 of the susceptor 2 in the region between the substrates 16, or a temperature measured on the wide face 8 facing towards the gap 10, depends on the type and material thickness of a coating on the wide face 3, or on a wide face 9 opposite the wide face 8 of the process chamber cover 7. In the example embodiment, the measured temperatures decrease as the coating is removed from the wide faces 3 or 9, and attain a minimum when the coating is completely removed. If reference temperatures of these wide faces 3 or 8 are determined under the same process parameters under which the cleaning process is executed, and if the continuous change of these temperatures is monitored in the course of the cleaning process, it can be concluded that the cleaning can be terminated when the temperatures measured in the course of cleaning sufficiently approach the reference temperature.

The invention takes advantage of this effect to define an event, the occurrence of which triggers the termination of an etching step. In preliminary tests, certain process parameters are adjusted, such as temperature measured with the temperature sensor 18, gas flows through the process chamber 6 and a certain composition of the temperature control gas flow supplied into the gap 10, together with total pressure in the process chamber 6, with clean, uncoated surfaces of the wide faces 3, 9, and temperatures of the wide faces 3 or 8. With process parameters adjusted in this manner, reference temperatures are measured at selected points 20. Comparison values are formed from these reference temperatures. The comparison values are, in particular, comparison temperatures, which differ from the reference temperatures within a specified tolerance range of about 3K, 5K, 6K or 10K. Provision can be made for the comparison temperature to be a temperature range, in the manner of a temperature window about the reference temperature.

In the course of the etching step, the same process parameters are adjusted, and in addition an etching gas is supplied into the process chamber. The change in the temperature measured at the measuring point 20 on the wide face 8 of the process chamber cover 7 is measured continuously. The measured temperature is compared with the comparison temperature obtained from the reference values, or a temperature window about a reference temperature. If the measured temperature falls below or above the reference temperature, or within the temperature window, this is taken as an event to terminate the etching step. The etching step can be terminated immediately by stopping the flow of etching gas. However, it is also possible for the etching gas to continue to flow for a specified time after the event has occurred.

In accordance with one variant of the invention, instead of the rear face temperature of the process chamber cover 7, a temperature can also be measured on the wide face 3 facing towards the process chamber 6. This temperature also changes by virtue of the continuous heat flux from the heating device 5 through the susceptor 2 to the opposite wall of the process chamber 6.

In accordance with a further variant, however, the temperature measured at the measuring point 20 can also be held constant by varying the composition of the temperature control gas supplied into the gap 10 by means of the temperature control gas supply line 22, and the cooling performance, with which the coolant flowing through the coolant channels 12 is cooled to the desired temperature, can be monitored. If this cooling performance falls within a specified range of a comparison value, the etching step can be discontinued.

In accordance with one variant of the invention, however, the heat output supplied into the heating device 5 can also be held constant, and the temperature sensor 18 can be used to measure the temperature of the susceptor, changing in the course of the etching step, and the etching step can be discontinued if this temperature falls within a range of a comparison value.

In accordance with one variant, however, the surface temperature of a storage location 25 on the wide face 3 of the susceptor 2 facing towards the process chamber 6 can also be measured, on which storage location a substrate 16 has been located in the previous coating step, and has shielded the surface from the formation of a parasitic coating. This surface temperature can be compared with a surface temperature measured in the region adjacent to the storage location 25. If the two temperatures converge to within a specified range, the etching step can be discontinued.

Figure 2:
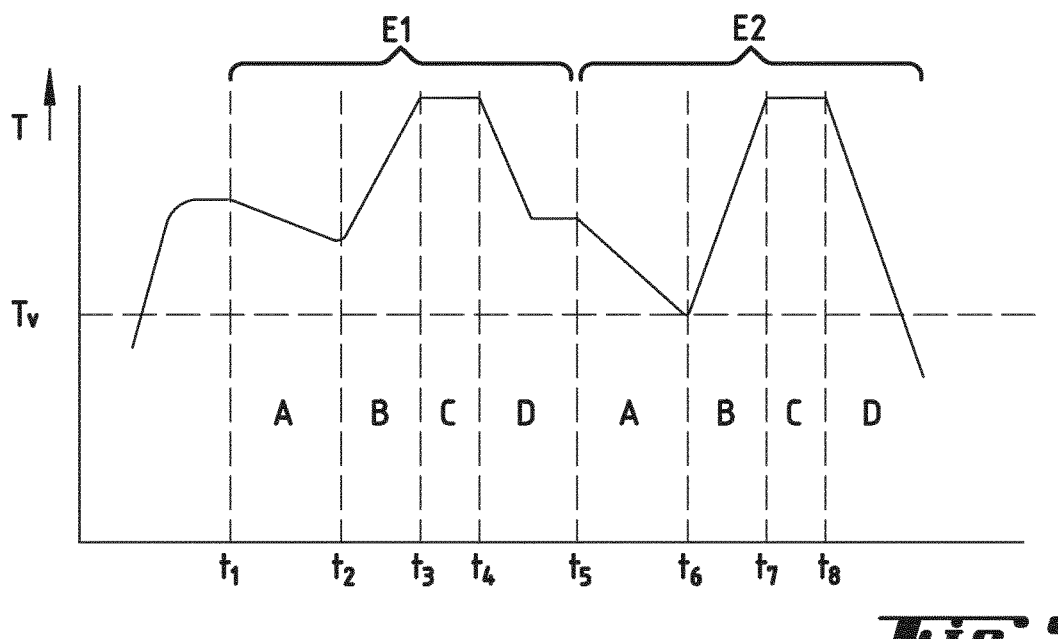
FIG. 2 shows, for a first example embodiment, the time profile of a temperature measured over time at the measuring point 20 on a process chamber cover 7 in a device shown in FIG. 1.

FIG. 2 shows an example embodiment in which, at the beginning of a cleaning process in a first cleaning step E1, the susceptor temperature is increased until it attains a specified value at a time t1, and this value has stabilized. At the time t1, a first etching gas, for example a compound containing chlorine, is supplied into the process chamber. The emissivity of the wide faces 3, 9 provided with parasitic coatings changes as a result of the action of the etching gas in this first cleaning phase, designated with A, so that a temperature T measured at the measuring point 20 continuously decreases. The first cleaning phase A is executed for a specified time. At the time t2 the etching gas is switched off, and a purging gas is supplied into the process chamber. In the course of this purging phase B, the susceptor temperature is increased. In a second cleaning phase C, beginning at the time t3, another cleaning gas is supplied into the process chamber, for example ammonia. At the time t4, the second cleaning gas is switched off, and a purging gas is supplied into the process chamber. In the course of this purging phase D, the susceptor temperature drops again and stabilizes up to the time t5. This is followed by a second cleaning step E2, which is essentially identical to the first cleaning step E1. The second cleaning step E2 includes another first cleaning phase A, a subsequent purging phase B, a second cleaning step C, and another purging phase D. In this example embodiment, a plurality of identical etching steps E1 and E2 consisting of different phases are executed in succession. In the example embodiment, only two etching steps E1 and E2 are shown. Any number of etching steps can be executed in succession. The etching steps are executed one after the other until the temperature measured at the measuring point 20 falls below the comparison temperature Tv. The entire cleaning process is then either discontinued, or a final etching step E+ is added.

The example embodiment shown in FIG. 3 shows a simplified cleaning process in which a first etching step E1 is initiated at a time t1, in which the etching gas is supplied into the process chamber. In the course of the etching process, the temperature T at the measuring point 20 is continuously monitored. In the example embodiment, the temperature T attains the comparison temperature Tv at the time t2 and thus triggers the event to terminate the cleaning process. A supplementary etching step E+ is executed for a time up to t3.

In one variant, provision is made for the comparison value Tv to change over time. The comparison value can, for example, depend on a further temperature measured within the CVD reactor. A first temperature T1 can, for example, be a temperature measured on a susceptor and, in particular, on a region that remains free of parasitic depositions in the course of coating. A second temperature T2 can be, for example, a temperature measured on a process chamber cover. The second temperature can be a temperature measured on the face of the process chamber cover 7 facing towards the process chamber 6. In this case, the second temperature is measured at a location where parasitic coatings form in the course of the coating process. Provision can also be made for the second temperature to be measured on the face of the process chamber cover 7 facing away from the process chamber 6. In this case, the second temperature is measured at a location not receiving parasitic depositions in the course of the coating process. A comparison value can be derived from the second temperature, which is, for example, the value of the measured second temperature reduced by a constant value. FIG. 4 shows a comparison value Tv that is a function of time. This is represented by the lower solid line in FIG. 4. The two dashed lines running next to the solid line identify a window. As soon as the temperature curve represented by the upper solid line enters the window, the etching gas supply is terminated. In the example shown in FIG. 4, the etching process E1 begins at the time t1 and ends at the time t2.

Figure 5:
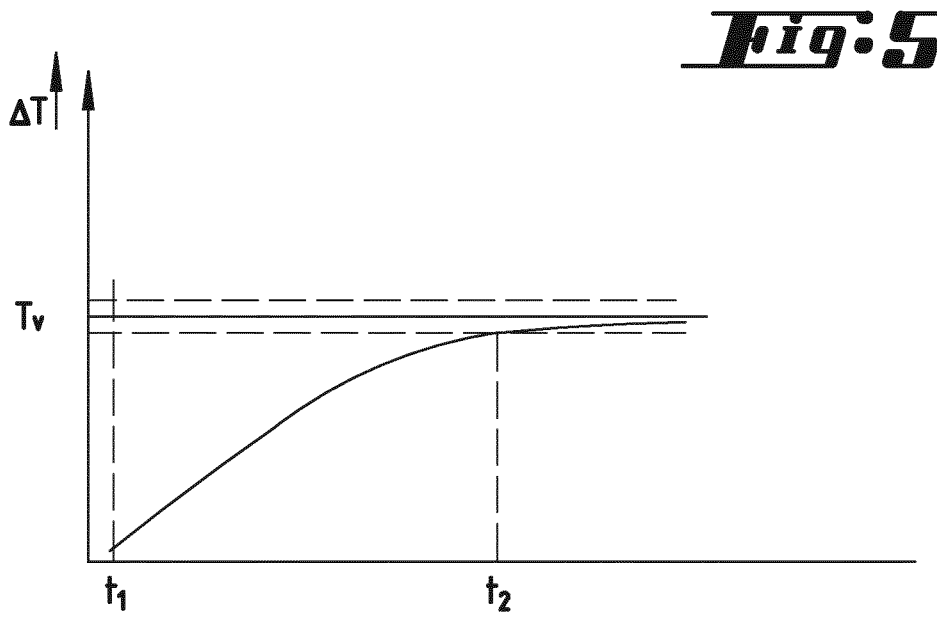
FIG. 5 shows an illustration as in FIG. 3 of a further example embodiment, in which, in the course of an etching step, the measured value of a temperature asymptotically approaches a final value.

FIG. 5 shows a variant in which the monitored temperature asymptotically approaches a constant value, which is represented by a horizontal line in FIG. 5. The two dashed lines running parallel to the latter identify a window. As soon as the measured temperature falls within the window at the time t2, the etching process is terminated. The horizontal line designated with Tv can be a specified temperature. The temperature measurement curve can be the curve of a single measured temperature, which is, for example, measured at a location on the susceptor. However, the temperature measurement curve can also be a relationship between two measured temperatures, for example, a difference between two temperatures, for example, the first temperature can be a temperature measured on the susceptor 2, and the second temperature can be a temperature measured on a process chamber cover 7.

Figure 6:
FIG. 6 shows an illustration similar to FIG. 5 of a measured curve of a temperature, which asymptotically approaches a final value.
Figure 6:
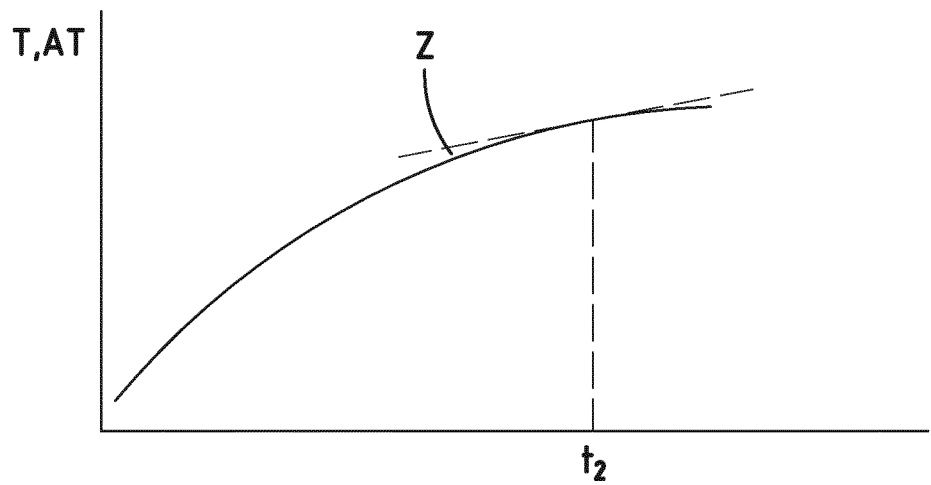

FIG. 6 shows another variant in which the solid curve is a measurement of a single temperature, for example, a monitored temperature that is measured on the susceptor 2. However, the measurement curve can also be a relationship between two measured temperatures, for example, a difference between a first temperature T1 measured on the susceptor 2 and a second temperature measured on the process chamber cover 7. With regard to the locations of the temperature measurements, reference is made to the previous statements.

A difference quotient, which represents a time derivative, is calculated from the measured values of the temperature, or the relationship between a plurality of measured temperatures, with a computing device. This time derivative is compared with a specified value Z. If the absolute value of the calculated time derivative is lower than the specified value Z, this is taken as a reason to terminate the etching process. The curve shown in FIG. 6 can also approach a final value asymptotically.

The method has previously been described using a single temperature measurement curve, or a curve representing a relationship between two temperatures. However, the method or the device in accordance with the invention also comprises such example embodiments in which more than two measured thermal responses are monitored to find the point in time at which to terminate the supply of the etching gas. The thermal responses can take the form of temperature measurements, emission measurements, heat outputs, or cooling performances.

The above statements serve to explain the inventions covered by the application as a whole, which in each case also independently advance the prior art at least by means of the following combinations of features, wherein two, a plurality, or all, of these combinations of features can also be combined, namely:

A method, which is characterized in that the thermal response is a temperature or an emissivity of a surface of the object 2, 2, 7, 8, 11, which has no coating.

A method, which is characterized in that the thermal response is a heat output or a cooling performance for purposes of regulating the temperature T.

A method, which is characterized in that, prior to the removal of the parasitic depositions, one or more crystalline layers are simultaneously deposited on a multiplicity of substrates 16, arranged on storage locations 25 on a susceptor 2 bounding the process chamber 6 on one face, by the supply of at least one organometallic compound of an element of the II-, III- or IV-main group and at least one hydride of an element of the IV-, V- or VI-main group, together with a carrier gas, in the course of which the parasitic depositions to be removed have formed, and after the deposition of the layers the substrates 16 are removed from the process chamber 6, and the etching gas is, or contains, an element of the VII-main group.

A method, which is characterized in that the monitored object is a region of a surface 3, 8 of a body 2, 7, which has the surface 3, 9 comprising the parasitic depositions to be removed, and/or in that the monitored object is a functional component of the process chamber.

A method, which is characterized in that the thermal response is measured with an optical measuring device 19.

A method, which is characterized in that the thermal response is a temperature T measured on a wide face 8 of a process chamber cover 7 bounding the process chamber 6, facing away from the process chamber 6, with all other process parameters held constant.

A method, which is characterized in that the comparison value Tv is a temperature T measured on the body 7, free of parasitic depositions, in preliminary tests under the same parameters, and/or in that the window is a temperature range about a reference temperature measured on the body 7, free of parasitic depositions, in preliminary tests under the same process parameters.

A method, which is characterized in that the monitored object 2, 3, 7, 8, 11 belongs to a body 7 receiving heat from the actively heated susceptor 2, and emitting heat to a heat sink 11.

A method, which is characterized in that the monitored object is a heating device 5, and the thermal response is a heat output of the heating device 5 for purposes of attaining a specified temperature T of a functional component 2 of the process chamber 6.

A method, which is characterized in that the monitored object is a cooling device 11, and the thermal response is a cooling performance of the cooling device 11 for purposes of attaining a specified temperature of a functional component 7 of the process chamber 6.

A method, which is characterized in that the comparison value Tv is a specified value, and/or in that the comparison value Tv is obtained simultaneously with the measured values Tt, and/or in that the comparison value Tv is continuously adjusted by means of machine learning.

A method, which is characterized in that the comparison values Tv are temperature values of the surfaces of the storage locations 25 of the substrates 16, and the measured values Tt are temperature values obtained on the surface 3 of the susceptor 6 external to the storage locations 25.

A method, which is characterized in that the measured values Tt are the composition or a mass flow rate of a temperature control gas 24, which is in an intermediate space 10 between a cooling body 11 and a body regulated to a specified temperature T, and/or the process chamber cover 7.

A method, which is characterized in that etching steps of equal or different duration E1, E2 are executed a number of times in succession, and/or in that the etching steps are executed until the measured values Tt have attained the comparison value Tv, or lie in a temperature window about a reference temperature, and/or in that after the measured values Tt have attained the comparison value Tv or lie in the window, a final etching step E+ is executed for a specified time, and/or in that each of the etching steps E1, E2, E+, or at least some of the said etching steps E1, E2, E+, have a first cleaning phase A, in which the etching gas is supplied into the process chamber 6, which is followed by a first purging phase B, which is followed by a second cleaning phase C, in which a cleaning gas is supplied into the process chamber 6, which is followed by a second purging phase D.

A method, which is characterized in that the comparison value Tv is determined in the course of the supply of the etching gas by monitoring of a second thermal response of at least one second object 2, 3, 7, 8, 11.

A method, which is characterized in that the comparison value Tv is the difference between a specified constant value and a thermal response determined on the second object 2, 3, 7, 8, 11.

A method, which is characterized in that measured values (Tt) are obtained by monitoring a thermal response of at least one object (2, 3, 7, 8, 11) in, or in the region near, the process chamber (6), and the supply of the etching gas is terminated when the absolute value of the time derivative of the profile of the measured values (Tt) falls below a specified value (Z).

A method, which is characterized in that first measured values Tt1 are obtained by monitoring a first thermal response of at least one first object 2, 3, 7, 8, 11 in, or in the region near, the process chamber 6, that second measured values Tt2 are obtained by monitoring a second thermal response of at least one second object 2, 3, 7, 8, 11 in, or in the region near, the process chamber 6, and in that the supply of the etching gas is terminated if a relationship of the two measured values Tt1, Tt2 falls within a window set about a comparison value Tv, or if the absolute value of the time derivative of the relationship between the two measured values Tt1, Tt2 falls below a specified value Z.

A method, which is characterized in that the relationship between the two measured values Tt1, Tt2 is a difference between the two measured values Tt1, Tt2.

A device, which is characterized in that the control device 23 is programmed in such a way that in the course of the supply of the etching gas of the susceptor 2 the time profile of a first temperature T of a first object 2, 3, 7, 8, 11, and/or the time profile of a second temperature T of a second object 2, 3, 7, 8, 11, in accordance with claims 1, 2, 3 to 6, or 14 to 18, is monitored, or the time profile of the measured values Tt of the performance of a heating device 5 or of a cooling device 11, of a composition, or of a mass flow rate of a temperature control gas 4 in accordance with one of the claims 11, 13, or 14, is monitored.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterize with their features independent inventive developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognisably be dispensed with for the respective intended use, or can be replaced by other means having the same technical effect.

LIST OF REFERENCE SYMBOLS

1 Reactor housing
2 Susceptor
3 Wide face
4 Wide face
5 Heating device
6 Process chamber
7 Process chamber cover
8 Wide face
9 Wide face
10 Gap
11 Cooling device
12 Cooling channel
13 Gas inlet unit
14 Gas outlet opening
15 Gas outlet unit
16 Substrate
17 Shaft
18 Temperature sensor
19 Temperature measuring device
20 Measuring point
21 Opening
22 Temperature control gas supply line
23 Control device
24 Temperature control gas source
25 Storage location
t1 Time
t2 Time
t3 Time
t4 Time
t5 Time
t6 Time
t7 Time
t8 Time A First cleaning phase
B First purging phase
C Second cleaning phase
D Second purging phase
E1 Etching step
E2 Etching step
E+ Etching step
T Temperature
Tv Comparison temperature
Z Time derivative
What is claimed is:

1. A method for removing parasitic depositions from surfaces of a process chamber (6) of a chemical vapor deposition (CVD) reactor, the method comprising:
   performing a coating process;
   performing an etching process that includes supplying an etching gas into the process chamber (6) while heating a susceptor (2) by a heating device (5);
   monitoring during the etching process a thermal response of a first component (2, 3, 7, 8, 11) with a first and second surface, the first component (2, 3, 7, 8, 11) located in, or adjacent to the process chamber (6) so as to obtain measured values (Tt), wherein the thermal response comprises a first temperature or an emissivity of the first surface of the first component (2, 3, 7, 8, 11), and wherein the first surface of the first component (2, 3, 7, 8, 11) remains free of parasitic depositions during the coating process;
   when at least one of the measured values (Tt) equals a comparison value (Tv) or falls within a window set about the comparison value (Tv), terminating a supply of the etching gas into the process chamber (6); and
   while the etching gas is being supplied, regulating a temperature control body to a specified temperature (T), or heating the temperature control body with a constant heat output, wherein the first component (2, 3, 7, 8, 11) is arranged in a heat transport path between the heating device (5) and a cooling device (11), and a parasitic coating on the second surface of the first component (2, 3, 7, 8, 11), which is exposed to the etching gas, influences an emissivity of the second surface of the first component (2, 3, 7, 8, 11), a change of which changes a heat flux between the heating device (5) and the cooling device (11).

2. The method of claim 1, further comprising before supplying the etching gas into the process chamber (6) so as to remove the parasitic depositions, (i) simultaneously depositing one or more crystalline layers on one or more substrates (16), arranged on one or more storage locations (25) on the susceptor (2) bounding the process chamber (6) on one side, by supplying at least one organometallic compound of an element of the II-, III- or IV-main group, and at least one hydride of an element of the IV-, V- or VI-main group, together with a carrier gas, during which the parasitic depositions to be removed are formed, and (ii) removing the one or more substrates (16) from the process chamber (6), wherein the etching gas comprises an element of the VII-main group.

3. The method of claim 2, wherein the comparison value (Tv) is a temperature value of a surface of the storage locations (25) of the one or more substrates (16), and the measured values (Tt) are temperature values of a surface (3) of the susceptor (6) external to the storage locations (25).

4. The method of claim 1, wherein the first component (2, 3, 7, 8) forms a portion of the process chamber (6).

5. The method of claim 1, wherein the thermal response is measured with an optical measuring device (19).

6. The method of claim 1, wherein the first surface of the first component (2, 3, 7, 8) is a first wide face (8) of a process chamber cover (7) bounding the process chamber (6), and facing away from the process chamber (6), and the second surface of the first component (2, 3, 7, 8, 11) is a second wide face (9) of the process chamber cover (7) facing the process chamber (6).

7. The method of claim 1, wherein at least one of:
   the comparison value (Tv) is a second temperature (T) measured on the first component (7) free of the parasitic depositions in preliminary tests; or
   the window is a temperature range about the second temperature (T) measured on the first component (7) free of the parasitic depositions in the preliminary tests.

8. The method of claim 1, wherein the monitored first component is a heating device (5), and the thermal response is the heat output of the heating device (5).

9. The method of claim 1, wherein the monitored first component is a cooling device (11), and the thermal response is the cooling performance of the cooling device (11).

10. The method of claim 1, wherein at least one of:
   the comparison value (Tv) is a specified value;
   the comparison value (Tv) is obtained simultaneously with the measured values (Tt); or
   the comparison value (Tv) is continuously adjusted by means of a machine learning algorithm.

11. The method of claim 1, wherein the measured values (Tt) are a composition, or a mass flow rate, of a temperature control gas (24) that is in an intermediate space (10) between the cooling device (11) and a process chamber cover (7).

12. The method of claim 1, wherein at least one of:
   the etching step is repeatedly executed in succession;
   after at least one of the measured values (Tt) equal the comparison value (Tv), or lie in the window, a final etching step (E+) is executed for a specified time; or
   the etching step comprises a first cleaning phase (A), in which the etching gas is supplied into the process chamber (6), which is followed by a first purging phase (B), which is followed by a second cleaning phase (C), in which a cleaning gas is supplied into the process chamber (6), which is followed by a second purging phase (D).

13. The method of claim 1, wherein the comparison value (Tv) is determined during the supply of the etching gas by monitoring a thermal response of a second component (2, 3, 7, 8, 11).

14. The method of claim 13, wherein the comparison value (Tv) is a difference between a specified constant value and the thermal response of the second component (2, 3, 7, 8, 11).

15. The method of claim 1, wherein the thermal response further comprises a heat output of the heating device (5) or a cooling performance of the cooling device (11).

16. The method of claim 1, wherein the supply of the etching gas into the process chamber (6) is further terminated when an absolute value of a time derivative of a profile of the measured values (Tt) is less than a specified value (Z).

17. A device, comprising:
   a chemical vapor deposition (CVD) reactor with a process chamber (6) arranged in a housing (1) of the CVD reactor;
   a susceptor (2) disposed in the process chamber, the susceptor (2) having a plurality of storage locations (25), each for storing a substrate (16);
   a heating device (5) for heating the susceptor (2);
   a cooling device (11);

a gas inlet unit (13) for supplying during an etching step an etching gas into the process chamber (6), and for supplying during a coating step at least one organome-tallic compound of an element of II-, III- or IV-main group, and at least one hydride of an element of IV-, V- or VI-main group, together with a carrier gas into the process chamber (6);

a measuring device (19) for determining a thermal response of a component (2, 3, 7, 8, 11) with a first and second surface, the component (2, 3, 7, 8, 11) located in, or adjacent to the process chamber (6) so as to obtain measured values (Tt), wherein the thermal response comprises a temperature or an emissivity of the first surface of the component (2, 3, 7, 8, 11), wherein the first surface of the first component (2, 3, 7, 8, 11) remains free of parasitic depositions during a coating process, and wherein the component (2, 3, 7, 8, 11) is arranged in a heat transport path between the heating device (5) and a cooling device (11), an emissivity of the second surface (3, 9) of the component (2, 3, 7, 8, 11) is influenced by a parasitic coating on the second surface (3, 9) of the component (2, 3, 7, 8, 11), which is exposed to the etching gas, and a change in the emissivity of the second surface (3, 9) changes a heat flux between the heating device (5) and the cooling device (11); and a control device (23) for controlling the supply of the etching gas through the process chamber (6), wherein the control device (23) is configured to terminate the supply the etching gas into the process chamber (6) when at least one of the measured values (Tt) obtained from the thermal response equals a comparison value (Tv) or falls within a window set about the comparison value (Tv).

18. The device of claim 17, wherein the component (2, 3, 7, 8) forms a portion of the process chamber (6).

19. The device of claim 18, wherein the first surface of the component (2, 3, 7, 8) is a first wide face (8) of a process chamber cover (7) bounding the process chamber (6), and facing away from the process chamber (6), and the second surface of the first component (2, 3, 7, 8, 11) is a second wide face (9) of the process chamber cover (7) facing the process chamber (6).

20. The device of claim 19, further comprising means for supplying a temperature control gas (24) into an intermediate space (10) between the cooling device (11) and the process chamber cover (7), wherein the measuring device (19) is configured to determine a composition or a mass flow rate of the temperature control gas (24).

* * * * *